(12) United States Patent
Eng et al.

(10) Patent No.: US 6,514,845 B1
(45) Date of Patent: *Feb. 4, 2003

(54) SOLDER BALL CONTACT AND METHOD

(75) Inventors: Kian Teng Eng, Singapore (SG); Kok Chin Fong, Singapore (SG)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 106 days.

(21) Appl. No.: 09/173,128

(22) Filed: Oct. 15, 1998

(51) Int. Cl.⁷ .............................................. H01L 21/44
(52) U.S. Cl. ...................... 438/613; 438/108; 438/612; 228/180.2
(58) Field of Search .................. 438/612, 613, 438/614, 106, 108; 257/737, 738, 772, 779, 778, 780; 228/180.2

(56) References Cited

U.S. PATENT DOCUMENTS

| | | | | |
|---|---|---|---|---|
| 5,275,330 A | * | 1/1994 | Issacs et al. ................. | 257/738 |
| 5,504,277 A | * | 4/1996 | Danner ......................... | 257/738 |
| 5,521,435 A | * | 5/1996 | Mizukoshi ................... | 257/738 |
| 5,615,477 A | * | 4/1997 | Sweitzer ....................... | 29/840 |
| 5,722,160 A | * | 3/1998 | Uemura et al. ............... | 29/840 |
| 5,734,560 A | * | 3/1998 | Kamperman et al. ....... | 257/738 |
| 5,764,485 A | * | 6/1998 | Lebaschi ...................... | 257/738 |
| 5,828,128 A | * | 10/1998 | Higashiguchi et al. ...... | 257/738 |

FOREIGN PATENT DOCUMENTS

| | | | |
|---|---|---|---|
| JP | 1-128545 | * | 5/1989 |
| JP | 2-37601 | * | 10/1991 |

\* cited by examiner

*Primary Examiner*—Olik Chaudhuri
*Assistant Examiner*—Alonzo Chambliss
(74) *Attorney, Agent, or Firm*—Jacqueline J. Garner; W. James Brady, III; Frederick J. Telecky

(57) ABSTRACT

The invention is a method for attaching an electronic component (40) having Ball Grid Array contacts (36) to a circuit board contact array (31) to prevent the solder balls (36) of the Ball Grid Array from fracturing and distorting during solder reflow when the Ball grid Array contact (36) is attached to a contact (31) on a printed circuit board (30) that has a via (32) extending at least partially though the printed circuit board (30). A solder form (35) is placed over each via (32) in each contact (31) of the contact array. The electronic component (40) that has BGA contacts (36) is placed over the contact array (31) such that each ball (36) of the ball grid array of the electronic component resides on a solder form (35). The component (40) and circuit board (30) is subjected to a solder reflow process to seal the component (40) to the circuit board (30). The solder form (35) at least partially fills the via (32) preventing the BGA contact (36) from collapsing into the via (32).

8 Claims, 2 Drawing Sheets

SOLDER BALL CONTACT AND METHOD

FIELD OF THE INVENTION

This invention relates to the formation of solder balls used in semiconductor devices such as a Ball Grid Array device, and more particularly to the structure and method of forming defect-free solder ball contacts.

BACKGROUND OF THE INVENTION

Ball Grid Array (BGA) semiconductor devices utilize a solder ball as the contact between the device and a mounting surface. In forming solder ball contacts, the solder ball is usually formed on a solid surface using a solder preform, and the solder ball is formed as the solder form is reflowed to form the spherical solder ball contact. When the BGA device is mounted, usually on a printed circuit board, the device is placed on an array of contact pads of solder, or a contact pad with a coating of solder thereon, with one solder ball contact on each pad. The circuit board, with the BGA device mounted thereon, is subjected to a solder reflow process in which a portion of the contact pad, or solder coating thereon, and solder ball contact partially melt, bonding the device to the circuit board.

Printed circuit boards have vias which interconnect various conductors on different layers of the circuit board. These vias usually extend completely through the circuit board layers forming an opening through the circuit board. Normally the board and contacts thereon are laid out so that a solder ball contact of the BGA device does not coincide with a via. However, as circuit boards become smaller with a higher density of components, at times it is necessary to place the device solder ball contacts over vias. Also, with devices with smaller pitch solder balls, the size of the solder ball becomes smaller while the via hole may remain the same size. The placement of a solder ball contact over a via often causes the solder ball contact to collapse during solder reflow since a portion of the solder ball contact flows into the via.

A similar problem is addressed in U.S. Pat. No. 5,511,305, wherein, in wave soldering processes, heat induced into the via and the solder joints of the solder ball contacts of BGA devices causes defects in the solder joints between the solder ball contact and the contact pad to which the solder ball is soldered. This problem is addressed by covering the via on the underside of the printed circuit board with an insulating material to shield the via from excessive heat during the wave soldering process. This reduces the heat flow through the via to the BGA device contacts on the surface of the printed circuit board.

SUMMARY OF THE INVENTION

The invention is a method for attaching an electronic component having Ball Grid Array contacts to a circuit board contact array to prevent the solder balls of the ball grid array from fracturing and distorting during solder reflow when the ball grid array contact is attached to a contact on a printed circuit board that has a via extending at least partially though the printed circuit board. A solder form is placed over each via in each contact of the contact array. The electronic component that has BGA contacts is placed over the contact array such that each ball of the ball grid array of the electronic component resides on a solder form. The component and circuit is subjected to a solder reflow process to seal the component to the circuit board. The solder form at least partially fills the via preventing the BGA contact from collapsing into the via.

DESCRIPTION OF A PREFERRED EMBODIMENT

Figure 1:
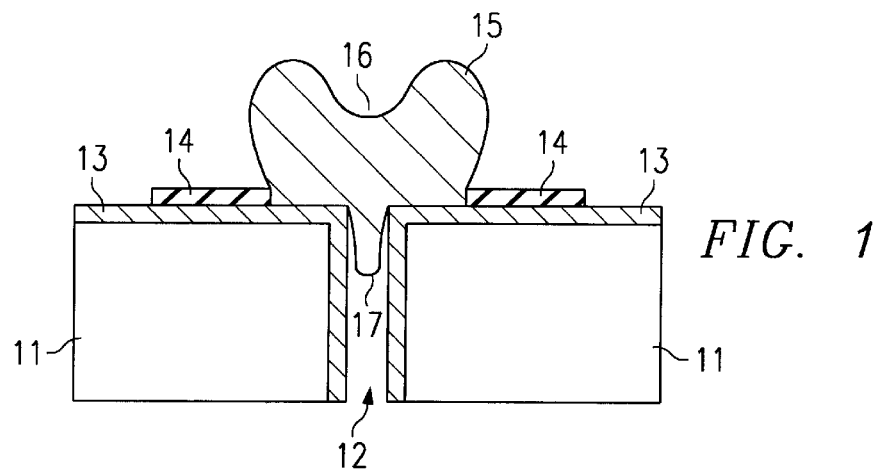
FIG. 1 shows the collapse of a solder ball over a via.

FIG. 1 shows a reflowed solder ball that has partially collapsed over a via. Printed circuit board 11 has a via 12 extending thought the board and in electrical contact with a contact pad 13 which surrounds via 12. Solder ball, during reflow, has partially collapsed forming indentation 16, and a portion 17 of solder ball 15 has flowed into Via 12. Solder ball 15 is confined to the top of contact pad 13 with a solder resist material 14.

Figure 2:
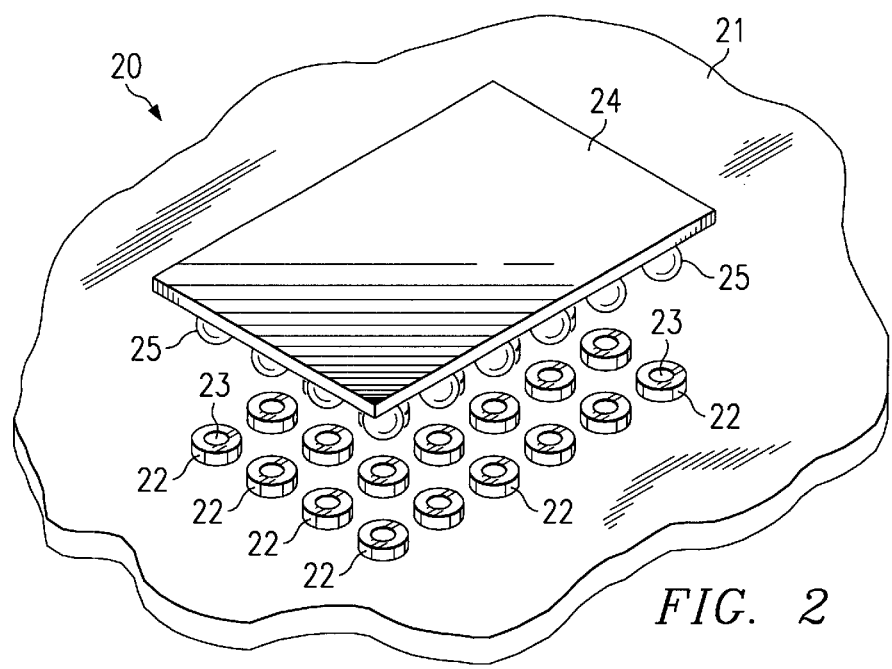
FIG. 2 shows a printed circuit board with an array of contact pads on which a device is mounted, each solder pad having a via in the center thereof.

FIG. 2 shows a partial view of a printed circuit board 21 having a plurality of contact pads 22 arrayed in a pattern for connecting BGA device 24 thereto. At least some of the contact pads 22 may have vias 23 located central to the contact pad, and extending through printed circuit board 21. BGA device 24 has a plurality of solder ball contacts 25 patterned to place one solder ball contact 25 over each contact pad 22. Device 24 is positioned on circuit board 21 with the solder ball contacts 25 in contact with contact pads 22, and then by solder reflow, the solder ball contacts 25 are fused to the contact pads 22. It is during the reflow process that one or more of the solder ball 25 contacts may partially flow into via 23, partially collapsing the solder ball.

Figure 3:
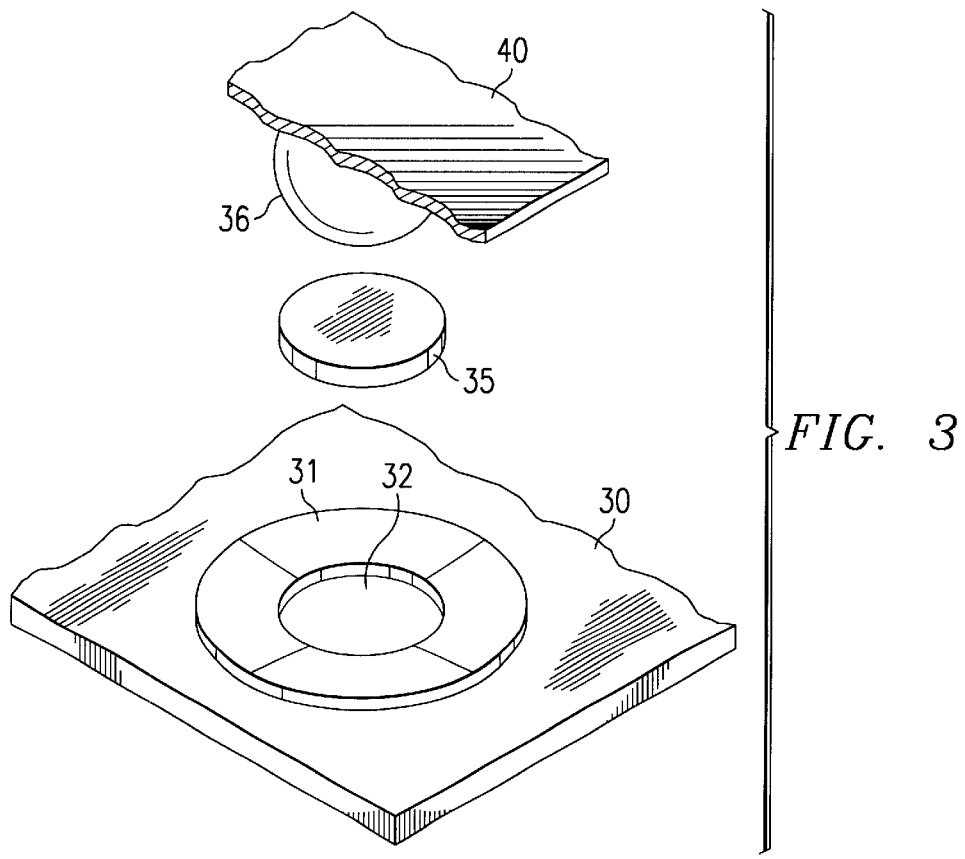
FIG. 3 Shows a printed circuit board with the components of the solder ball of the present invention.

FIG. 3 is a partial view of a printed circuit board 30 showing a single contact pad 31 having a via 32 located therein. Via 32 extends through printed circuit board 30. A solder ball contact 36 is shown with a solder form 35 positioned between contact pad 31 and solder ball contact 36.

Figure 4:
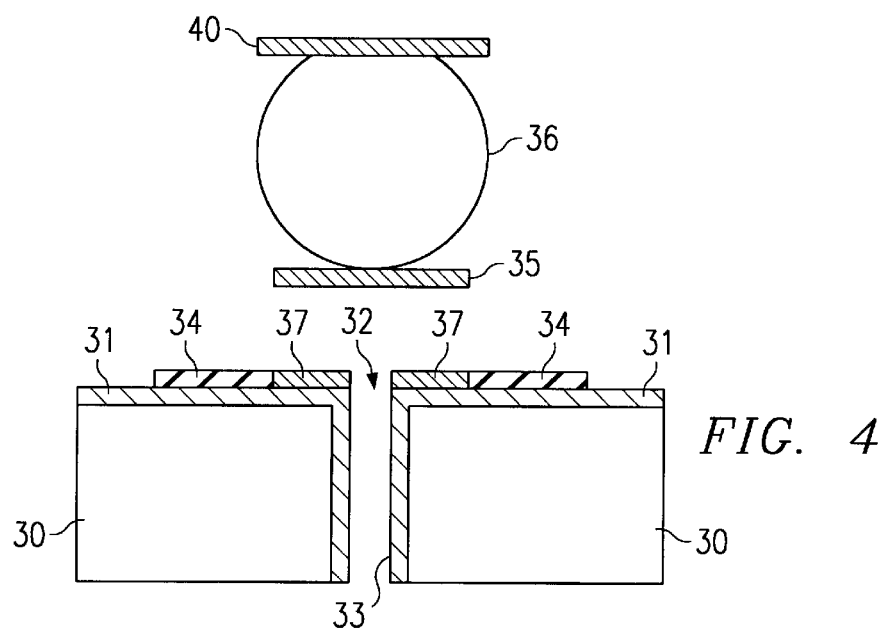
FIG. 4 is a side view showing the placement of the solder ball components.

FIG. 4 is a side view showing circuit board 30, via 32 and contact pad 31. The wall 33 of via 32 is electrically connected to contact pad 31 to provide electrical connection from contact pad 31 through circuit board 30 and to any other connections such as intermediate layers (not illustrated) that circuit board 30 may have if it is a multilayer circuit board. Contact pad 31 and via walls 33 may be of copper, or may have a layer of solder, gold, or other electrically conductive material thereon to which the solder ball contact may be attached by solder reflow. In the present invention, a solder form 35 is placed between solder ball contact 36 and the surface of contact pad 31. A solder mask 34 may be placed on a portion of contact pad 31 to confine the solder flow during the reflow process. Solder form 35 may be of any desired shape, such as a flat disk, a compressed solder ball, or a circular coil of solder material. Solder form 35 may be of the same solder composition as solder ball 36, or may be of a slightly lower melting solder. A solder flux material 37 may be coated on solder pad 31 prior to reflow.

During reflow, solder form 35 is in contact with contact pad 31, and solder ball 36 is in contact with form 35. Only one form 35 and solder ball 36 is illustrated, but all the contacts of the BGA device (device 24 as illustrated in FIG. 2) are in contact with the array of contact pads (FIG. 2). During the reflow process, the solder flux 37 (FIG. 4) on the contact pad 31 causes a portion of form 35 to flow into via 32, and solder ball 36 will remain in its spherical shape since it cannot collapse as shown in FIG. 1 because form 35 has sealed the opening through via 32.

Figure 5:
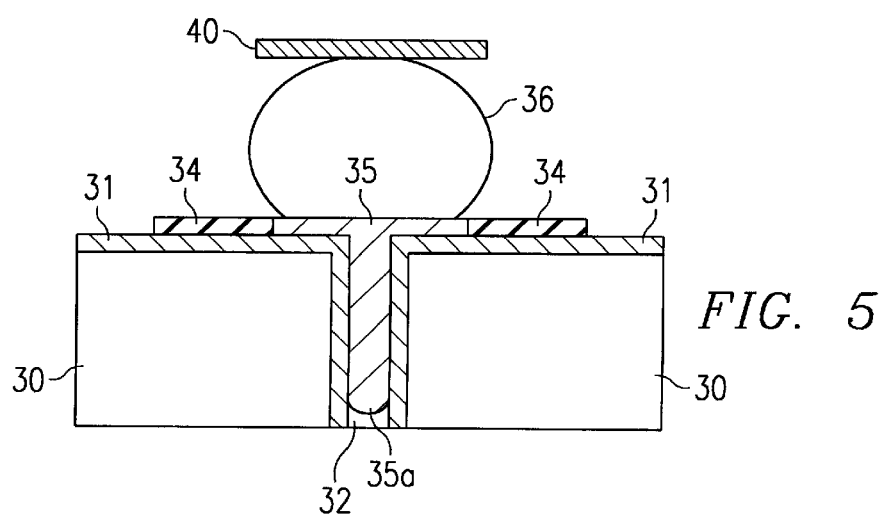
FIG. 5 shows the formed solder ball after reflow.

FIG. 5 shows solder ball contact 36 after reflow. A portion 35a of form 35 has flowed into via 32 and a portion of form 35 on contact pad 31 attaches solder ball 36 to contact pad 31. By using form 35 between contact pad 31 and solder ball 36, a distortion of solder 36 is prevented.

What is claimed is:

1. A method for attaching an electronic component having Ball Grid Array contacts to a circuit board contact array to prevent the solder balls of the ball grid array from fracturing and distorting during solder reflow, where at least some of the contacts in the circuit board array have vias extending through the circuit board, comprising the steps of:

placing a solder form over each via in each contact of the contact array, placing a solder flux on the circuit board contact array under the solder form;

placing the electronic component over the contact array such that each ball of the ball grid array of the electronic component resides on a solder form; and after placing the electronic component over the contact array, subjecting the electronic component and circuit board to a solder reflow process to seal the component to the circuit board and flow a portion of each solder form over the via into said via but not the balls of the BGA.

2. The method according to claim 1, wherein said solder form is in the form of one of; a flat plated; a circular coil; and a pressed solder ball.

3. The method according to claim 1, wherein said solder form has a lower melting temperature than the solder balls of the Ball Grid Array contacts on the electronic component.

4. The method according to claim 1, including the step of at least partially masking each contact of the contact array to limit the solder from the attachment area.

5. A method of fabricating an integrated circuit, comprising the steps of:

providing an electronic component having Ball Grid Array (BGA) contacts;

providing a circuit board having a contact array, wherein at least some of the contacts in the contact array have vias extending through the circuit board;

placing a solder form over each via in each of the contacts having vias;

placing a solder flux on the circuit board contact array under the solder form;

placing the electronic component over the contact array such that each ball of the BGA resides on a solder form;

simultaneously reflowing the BGA contacts, solder flux and solder forms to both seal the electronic component to the circuit board and flow a portion of the solder forms, but not the balls of the BGA, into each via in each of the contacts having vias.

6. The method according to claim 5, wherein said solder form is in the form of one of; a flat plated; a circular coil; and a pressed solder ball.

7. The method according to claim 5, wherein said solder form has a lower melting temperature than the solder balls of the Ball Grid Array contacts on the electronic component.

8. The method according to claim 5, including the step of at least partially masking each contact of the contact array to limit the solder from the attachment area.

* * * * *